(12) United States Patent
Chen et al.

(10) Patent No.: US 11,622,084 B2
(45) Date of Patent: Apr. 4, 2023

(54) HYPERSPECTRAL CAMERA BASED ON CONTINUOUSLY VARIABLE FILM FILTER AND COATING METHOD THEREOF

(71) Applicant: SICHUAN DUALIX SPECTRAL LMAGING TECHNOLOGY CO., LTD, Sichuan (CN)

(72) Inventors: Xinghai Chen, Sichuan (CN); Yelin Liu, Sichuan (CN); Zhihui Huang, Sichuan (CN); Hongyu Zhang, Sichuan (CN); Yu Huang, Sichuan (CN)

(73) Assignee: Jiangsu Dualix Spectral Imaging Technology Co., Ltd, Wuxi (CN)

( * ) Notice: Subject to any disclaimer, the term of this patent is extended or adjusted under 35 U.S.C. 154(b) by 346 days.

(21) Appl. No.: 16/914,472

(22) Filed: Jun. 29, 2020

(65) Prior Publication Data
US 2020/0329205 A1    Oct. 15, 2020

(30) Foreign Application Priority Data

Apr. 2, 2020  (CN) .......................... 202010256998.7
Apr. 2, 2020  (CN) .......................... 202010257302.2
(Continued)

(51) Int. Cl.
*H04N 5/33* (2006.01)
*G02B 5/20* (2006.01)
(Continued)

(52) U.S. Cl.
CPC ............... *H04N 5/33* (2013.01); *G02B 5/208* (2013.01); *G03F 7/70316* (2013.01); *G02B 13/14* (2013.01)

(58) Field of Classification Search
CPC .......... H04N 5/33; G02B 5/208; G02B 13/14; G03F 7/70316
(Continued)

(56) References Cited

U.S. PATENT DOCUMENTS

| 2006/0017924 A1* | 1/2006 | Kowarz | .................... | G01J 3/32 356/330 |
| 2007/0146700 A1* | 6/2007 | Kowarz | .................... | G01J 3/02 356/310 |

(Continued)

*Primary Examiner* — Jayanti K Patel
*Assistant Examiner* — Richard B Carter

(57) ABSTRACT

A hyperspectral camera based on a continuously variable film filter and a coating method thereof can solve interference between partial bands of the hyperspectral camera based on the continuously variable film filter. The hyperspectral camera includes: a camera body and a detector chip, wherein a continuously variable film is coated on the detector chip; a semi-transmission half-cut filter is provided in front of the continuously variable film, and a distance between the semi-transmission half-cut filter and the continuously variable film is 0 mm. According to the present invention, the semi-transparent half-cut filter and the detector chip are integrated without any gap therebetween. As a result, optical interference caused by incident light sequentially passing through the semi-transparent half-cut filter and the detector chip is greatly reduced, which can reduce distortion of spectral signals, and finally satisfy wide-band application requirements which can be truly realized based on such technology.

8 Claims, 4 Drawing Sheets

(30) Foreign Application Priority Data

Apr. 2, 2020 (CN) .......................... 202020472164.5
Apr. 2, 2020 (CN) .......................... 202020472610.2

(51) Int. Cl.
*G03F 7/20* (2006.01)
*G02B 13/14* (2006.01)

(58) Field of Classification Search
USPC .......................................................... 359/355
See application file for complete search history.

(56) References Cited

U.S. PATENT DOCUMENTS

| | | | |
|---|---|---|---|
| 2007/0206242 A1* | 9/2007 | Smith | H04N 3/1593 |
| | | | 348/E3.032 |
| 2017/0227398 A1* | 8/2017 | Bartosewcz | G01J 3/2823 |
| 2018/0224332 A1* | 8/2018 | Ooi | G01J 3/26 |
| 2021/0072081 A1* | 3/2021 | Wang | G06N 20/00 |

\* cited by examiner

HYPERSPECTRAL CAMERA BASED ON CONTINUOUSLY VARIABLE FILM FILTER AND COATING METHOD THEREOF

CROSS REFERENCE OF RELATED APPLICATION

The present invention claims priority under 35 U.S.C. 119(a-d) to CN 202020472164.5, filed Apr. 2, 2020; CN 202010256998.7, filed Apr. 2, 2020; CN 202020472610.2, filed Apr. 2, 2020; and CN 202010257302.2, filed Apr. 2, 2020;

BACKGROUND OF THE PRESENT INVENTION

Field of Invention

The present invention relates to a technical field of hyperspectral camera, and more particularly to a hyperspectral camera based on a continuously variable film filter and a coating method thereof.

Description of Related Arts

The development of imaging technology has gone through about 4 stages. The first stage is the grayscale image stage, where the image has only a maximum of 256 grayscales. The second stage is the color image stage, where the image is created with three specific wavelengths: red, green, and blue in the visible light region. The third stage is the multi-spectral image stage, where a multi-spectral system is composed of filters in a specific band to obtain a multi-spectral image in this band. Compared to the RGB image, such image has more spectral information. The fourth stage is the hyperspectral imaging stage. The biggest feature of this stage includes continuous spectrum, a plurality of bands, and extraction of more characteristic spectra with a guaranteed high spectral resolution.

Among them, hyperspectral imaging is a comprehensive technology integrating detector technology, precision optical machinery, weak signal detection, computer technology, and information processing technology. It is a multi-dimensional information acquisition technology that combines imaging technology and spectral technology, which detects the two-dimensional geometric space and one-dimensional spectral information of the target at the same time to obtain continuous and narrow-band image data with a high spectral resolution.

Conventional hyperspectral imaging is mainly filter-based imaging. For example, a typical LCTF hyperspectral imager generally consists of five parts: an objective lens, a liquid crystal tunable filter, a relay imaging optical system, a camera, and a control system. The principle is: by continuously acquiring a series of two-dimensional images of the sample under a series of wavelengths, each wavelength ($\lambda$) will have one corresponding two-dimensional image, thereby obtaining a three-dimensional image. The advantage is that a high-resolution hyperspectral image can be obtained with a high-resolution camera, but the disadvantages are low light transmission efficiency, low spectral resolution, few spectral channels, and high cost.

Another type of hyperspectral imaging is push-broom imaging technology based on grating spectroscopic imaging spectrometer, whose structure is formed by three parts: an imaging lens, an imaging spectrometer, and an area array detector, such as a CCD camera. The principle is that a line of a two-dimensional object is imaged by the imaging lens and passes through a front slit of the spectrometer, then light passes through a group of lenses to become parallel light perpendicular to the direction of the slit; the parallel light passes through a transmission grating in the spectrometer and is dispersed in the direction perpendicular to the slit, thus becoming monochromatic light spreading with wavelength in the direction perpendicular to the slit; and the monochromatic light spreading in the direction perpendicular to the slit is imaged onto the area array detector through the last group of lenses of the spectrometer. The advantages are high spectral resolution, multiple spectral channels, and high grating diffraction efficiency, but the disadvantages are high cost and requiring a scanning mechanism for push-broom imaging.

The above-mentioned hyperspectral imaging uses a high-sensitivity CCD chip or SCMOS chip as a substrate, and the technical means for coating filter films of different wavelength bands on the CCD chip or the SCOMS chip has been widely used. In order to overcome the disadvantages of the above-mentioned filter-based imaging and the push-broom imaging technology based on the grating spectroscopic imaging spectrometer, hyperspectral imaging technology with continuously variable film coating has been developed, which has a simpler structure, a smaller size, and a lower cost, and is one of the ideal choices to popularize hyperspectral technology.

Conventionally, the hyperspectral camera based on the continuously variable film adopts a wedge-shaped film on an area array detector chip based on the principle of Fabry-Perot interference, so as to realize continuous gradient of transmission wavelengths. The continuously variable film coating camera has no response at 900 nm for short wavelength light such as 450 nm light. On the contrary, there is a significant response at 450 nm for long wavelength light such as 900 nm light, and there is also a weak response at 600 nm, which can be ignored. That is to say, a short-wavelength film filter position can also transmit light of double the wavelength, which will cause distortion of the collected spectral signal.

In summary, bands of the conventional hyperspectral camera based on the continuously variable film filter interfere with each other, which may cause distortion of the collected spectral signal. Therefore, there is an urgent need for a hyperspectral camera based on a continuously variable film filter that can solve the above technical problems.

SUMMARY OF THE PRESENT INVENTION

Based on the above problems, the present invention provides a hyperspectral camera based on a continuously variable film filter and a coating method thereof, to solve interference between partial bands of the hyperspectral camera based on the continuously variable film filter. The interference will result in distortion of collected images and spectral information, which prevents the technology to achieve wide-band detection.

Accordingly, in order to accomplish the above object, the present invention provides:

a hyperspectral camera based on a continuously variable film filter, comprising: a camera body, wherein a detector chip is installed in the camera body, and a continuously variable film is coated on the detector chip; a semi-transmission half-cut filter is provided in front of the continuously variable film, and a distance between the semi-transmission half-cut filter and the continuously variable film is 0 mm or larger than 0 mm.

Preferably, the semi-transmission half-cut filter is coated on the continuously variable film.

Preferably, a mounting structure, which is not in contact with the continuously variable film, is installed in front of the continuously variable film, and the semi-transmission half-cut filter is coated on the mounting structure.

Preferably, the mounting structure comprises a lens structure or a packaging structure.

Preferably, the semi-transmission half-cut filter comprises an infrared cut-off film and a transmission film group.

Preferably, the transmission film group comprises a visible light cut-off film or a full transmission film.

The present invention also provides a coating method for a hyperspectral camera based on a continuously variable film filter, comprising steps of:

installing a detector chip in a camera body, and coating a continuously variable film on the detector chip; then placing an infrared cut-off film and a visible light cut-off film in a same plane in front of the continuously variable film, wherein the infrared cut-off film corresponds to a visible light band of the continuously variable film, and the cut-off film corresponds to an infrared light band of the continuously variable film.

Preferably, the coating method comprises specific steps of:

installing the detector chip in the camera body, and coating the continuously variable film on the detector chip; then coating the infrared cut-off film and the visible light cut-off film in the same plane on the continuously variable film.

Preferably, the coating method comprises specific steps of:

installing a detector chip in the camera body, and coating a continuously variable film on the detector chip; then installing a mounting structure, which is not in contact with the continuously variable film, in front of the continuously variable film in the camera body, and coating the infrared cut-off film and the visible light cut-off film in the same plane on the mounting structure.

Beneficial effects of the present invention are as follows.

(1) In the present invention, the semi-transparent half-cut filter is directly coated on the detector chip which is coated with the continuously variable film, so that the semi-transparent half-cut filter and the detector chip are integrated without any gap therebetween. As a result, optical interference caused by incident light sequentially passing through the semi-transparent half-cut filter and the detector chip is greatly reduced, which can reduce distortion of spectral signals, and finally satisfy wide-band application requirements which can be truly realized based on such technology.

(2) In the present invention, when the distance between the semi-transparent half-cut filter and the continuously variable film is larger than 0 mm, the semi-transparent half-cut filter and the detector are separately coated through separately placing the semi-transparent half-cut filter on the mounting structure. Therefore, the spectral band range is wider, the process requirements and manufacturing costs are lower, and the flexibility of preparing the semi-transparent half-cut filter is higher.

(3) In the present invention, the semi-transparent half-cut filter is designed and mounted in front of the detector chip, which is provided on the mounting structure. By rotating the mounting structure, different areas of the semi-transparent half-cut filter can be precisely docked with areas of the detector chip, so as to use the semi-transparent half-cut filter to achieve a light leakage effect of the detector chip.

(4) In the present invention, the hyperspectral camera based on the continuously variable film filter can rely on the development of modern detector technology to select a better detector with higher sensitivity and higher pixel as a detection unit. And with the development of coating technology, a suitable and economical coating camera can be selected according to the application needs to obtain target images and spectral information.

(5) In the present invention, a spectral testing range of the hyperspectral camera based on the continuously variable film filter can be expanded to reduce interference on image and spectrum caused by multi-level light transmission, so as to ensure that each collected image has highly consistent spatial structure layout, precise spectral distribution and completely match image.

Element reference: 1—camera body, 2—detector chip, 3—continuously variable film, 4—semi-transparent half-cut filter, 41—visible light cut-off film, 42—infrared cut-off film, 5—lens structure, 6—packaging structure.

DETAILED DESCRIPTION OF THE PREFERRED EMBODIMENT

In order to better illustrate the present invention to those skilled in the art, the present invention will be further described in detail with reference to the accompanying drawings and the following embodiments.

Embodiment 1

Figure 1:
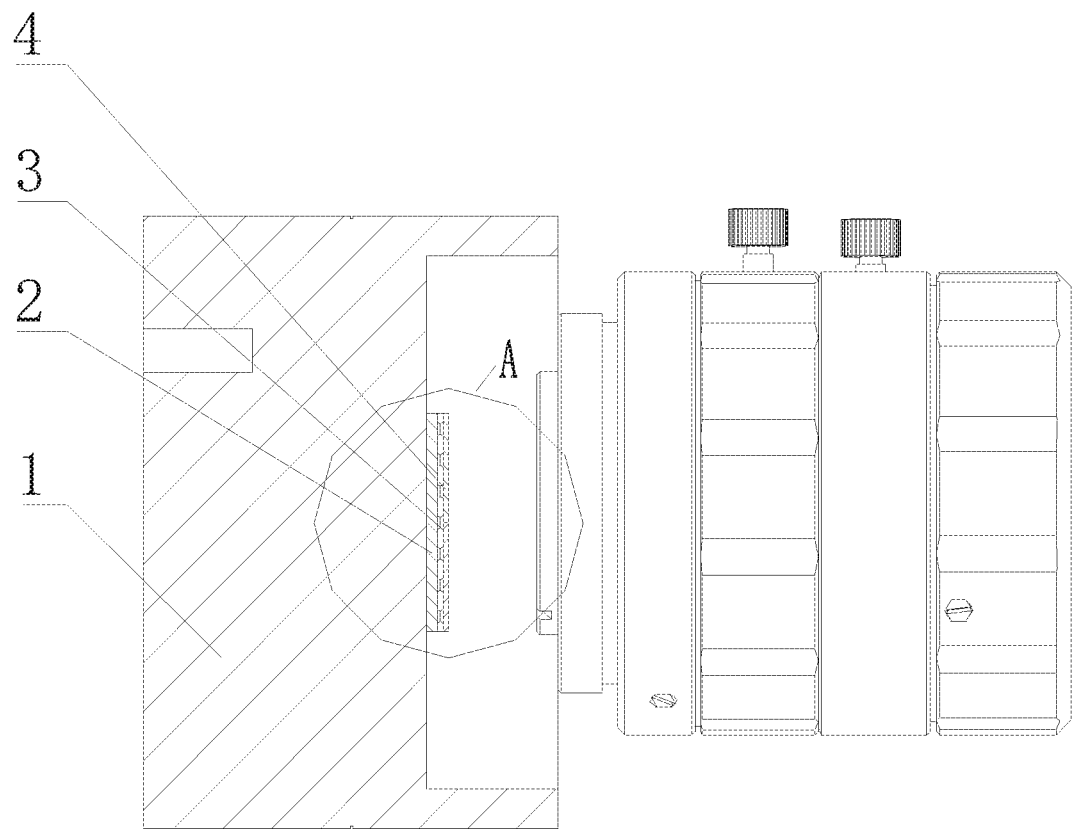
FIG. 1 is a front cross-sectional view of the present invention when a distance between a semi-transparent half-cut filter and a continuously variable film is 0 mm.
Figure 2:
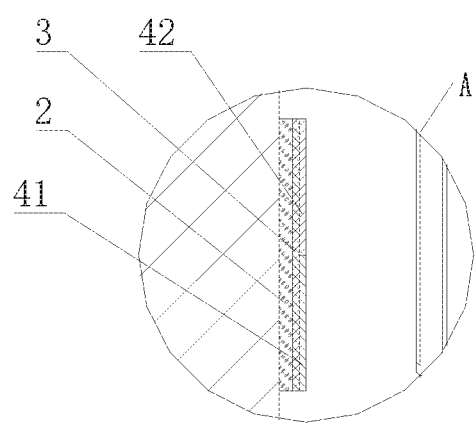
FIG. 2 is an enlarged view of a position A in FIG. 1 of the present invention.
Figure 3:
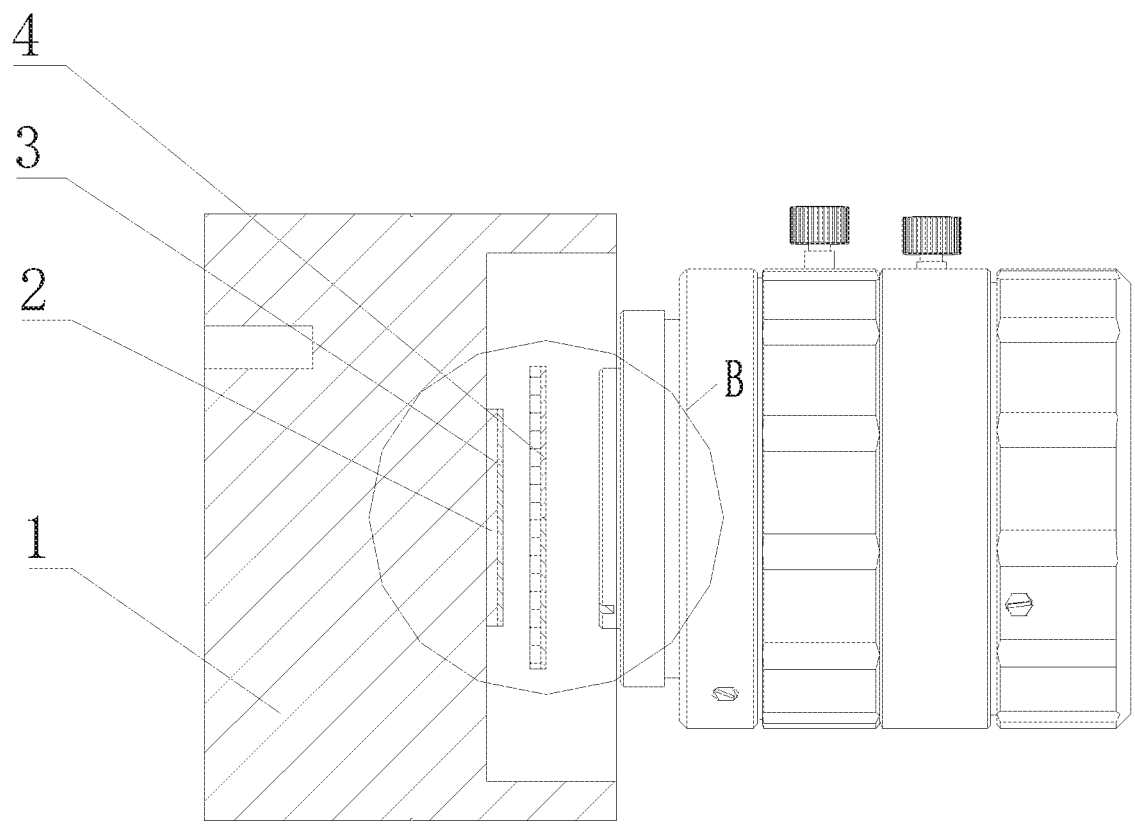
FIG. 3 is a front cross-sectional view of the present invention when a mounting structure is a lens structure.
Figure 4:
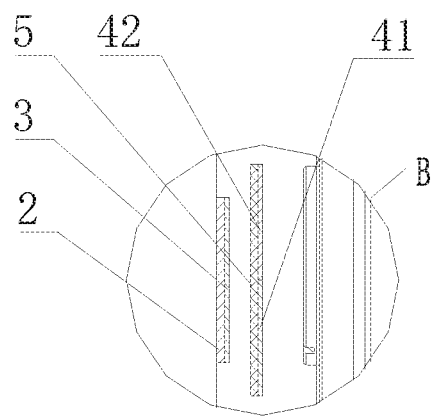
FIG. 4 is an enlarged view of a position B in FIG. 3 of the present invention.
Figure 5:
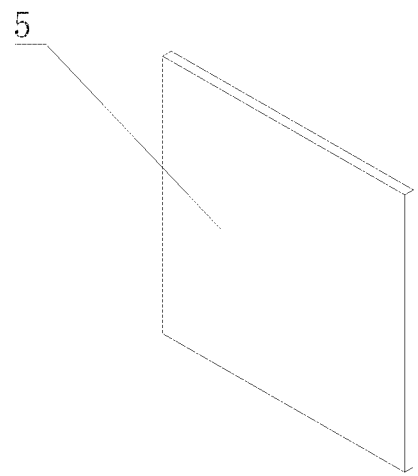
FIG. 5 is a perspective view of the lens structure of the present invention.
Figure 6:
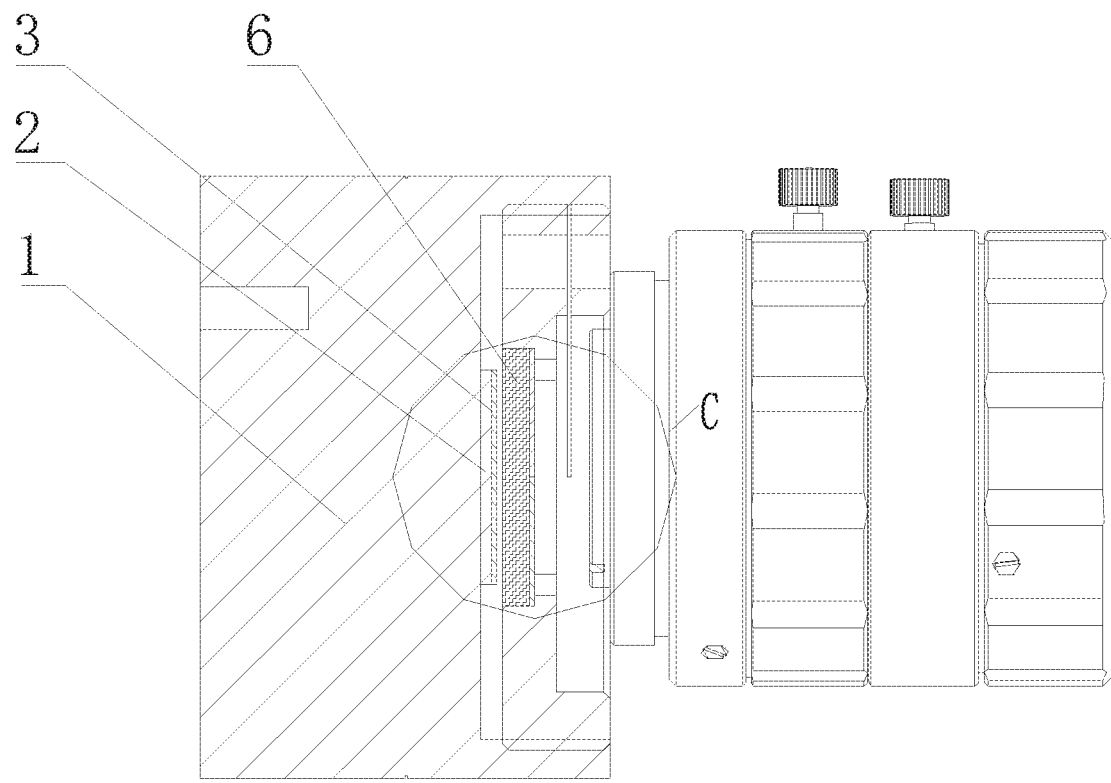
FIG. 6 is a front cross-sectional view of the present invention when the mounting structure is a packaging structure.
Figure 7:
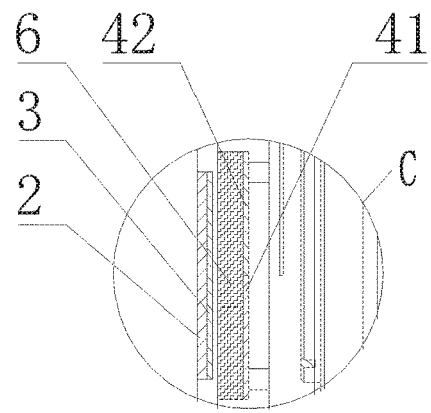
FIG. 7 is an enlarged view of a position C in FIG. 6 of the present invention.
Figure 8:
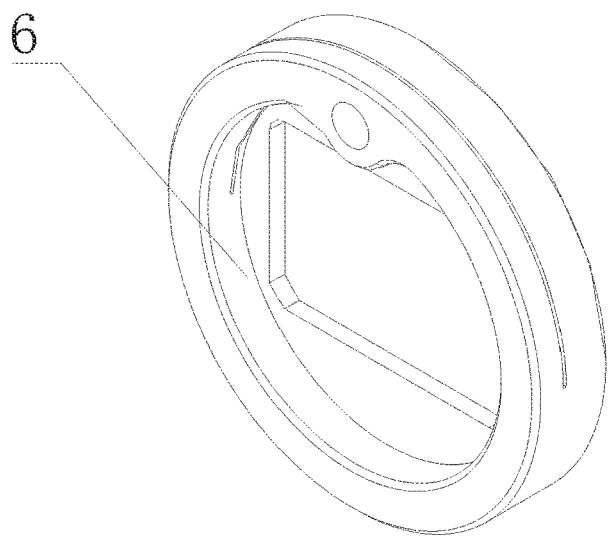
FIG. 8 is a perspective view of the packaging structure of the present invention.
Figure 9:
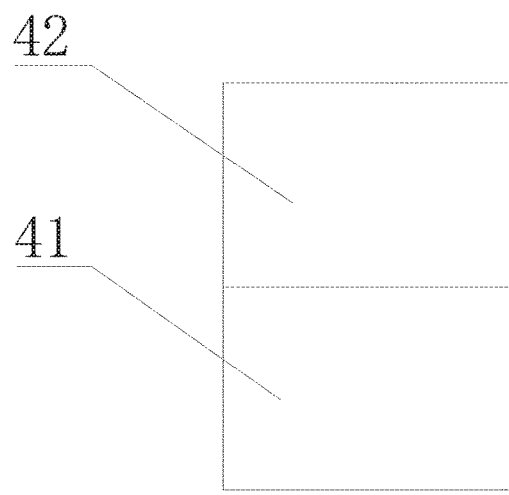
FIG. 9 illustrates a positional relationship between an infrared cut-off film and a visible light cut-off film of the present invention.

Referring to FIGS. 1-2 and 9, a hyperspectral camera based on a continuously variable film filter is illustrated, comprising: a camera body 1, wherein a detector chip 2 is installed in the camera body 1, and a continuously variable film 3 is coated on the detector chip 2; a semi-transmission half-cut filter 4 is provided in front of the continuously variable film 3, and a distance between the semi-transmission half-cut filter 4 and the continuously variable film 3 is 0 mm.

A coating method for a hyperspectral camera based on a continuously variable film filter is also provided, comprising steps of:

installing a detector chip 2 in a camera body 1, and coating a continuously variable film 3 on the detector chip 2; then placing an infrared cut-off film 42 and a visible light cut-off film 41 in a same plane in front of the continuously variable film 3, wherein the infrared cut-off film 42 corresponds to a visible light band of the continuously variable film 3, and the cut-off film 41 corresponds to an infrared light band of the continuously variable film 3.

Working principle: when the distance between the semi-transmission half-cut filter 4 and the continuously variable film 3 is 0 mm, the semi-transmission half-cut filter 4 is directly coated on a surface of the continuously variable film 3. The detection chip is coated with the continuously variable film 3, and a range of the continuously variable film 3 is expanded, which covers a band of 400 nm-1000 nm. The continuously variable film 3 is coated with the semi-transmission half-cut filter 4 which is divided into two parts: one half is the infrared cut-off film 42, wherein the infrared cut-off film 42 corresponds to the visible light band of the continuously variable film 3, and preferably parallel to the continuously variable film 3 to cut off the infrared spectrum; the other half is the visible light cut-off film 41 or a full transmission film, wherein the full transmission film means no treatment is performed, and all incoming light information is allowed to pass through. The visible light cut-off film 41 or the full transmission film corresponds to the infrared light band of the continuously variable film 3, and preferably parallel to the continuously variable film 3 to realize a solution of multi-level light transmission effect. The visible light cut-off film 41 can avoid influence of 400-500 nm band optical information on collection of 800-1000 nm band data, and experiments verified that the 400-500 nm band optical information has little effect on collection of the 800-1000 nm band data.

In summary, the semi-transparent half-cut filter 4 is directly coated on the detector chip 2 which is coated with the continuously variable film 3, so that the semi-transparent half-cut filter 4 and the detector chip 2 are integrated without any gap therebetween. As a result, optical interference caused by incident light sequentially passing through the semi-transparent half-cut filter 4 and the detector chip 2 is greatly reduced, which can reduce distortion of spectral signals.

Embodiment 2

Referring to FIGS. 3-5 and 9, a hyperspectral camera based on a continuously variable film filter is illustrated, comprising: a camera body 1, wherein a detector chip 2 is installed in the camera body 1, and a continuously variable film 3 is coated on the detector chip 2; a semi-transmission half-cut filter 4 is provided in front of the continuously variable film 3, and a distance between the semi-transmission half-cut filter 4 and the continuously variable film 3 is larger than 0 mm.

A coating method for a hyperspectral camera based on a continuously variable film filter is also provided, comprising steps of:

installing the detector chip 2 in the camera body 1, and coating the continuously variable film 3 on the detector chip 2; then installing a lens structure 5, which is not in contact with the continuously variable film 3, in front of the continuously variable film 3 in the camera body 1, and coating the infrared cut-off film 42 and the visible light cut-off film 41 in the same plane on the lens structure 5, wherein the infrared cut-off film 42 corresponds to a visible light band of the continuously variable film 3, and the cut-off film 41 corresponds to an infrared light band of the continuously variable film 3.

When the distance between the semi-transmission half-cut filter 4 and the continuously variable film 3 is larger than 0 mm, the lens structure 5 is provided in front of the continuously variable film 3 without contacting. However, the lens structure 5 is required to be as close as possible to the continuously variable film 3, in such a manner that optical interference caused by incident light sequentially passing through the semi-transparent half-cut filter 4 and the detector chip 2 is greatly reduced, which can reduce distortion of spectral signals.

According to the embodiment 2, the detection chip is still coated with the continuously variable film 3, and a range of the continuously variable film 3 is expanded, which covers a band of 400 nm-1000 nm. The lens structure coated with the semi-transmission half-cut filter 4 is provided in front of the continuously variable film 3, which is divided into two parts: one half is the infrared cut-off film 42, wherein the infrared cut-off film 42 corresponds to the visible light band of the continuously variable film 3, and preferably parallel to the continuously variable film 3 to cut off the infrared spectrum; the other half is the visible light cut-off film 41 or a full transmission film, wherein the full transmission film means no treatment is performed, and all incoming light information is allowed to pass through. The visible light cut-off film 41 or the full transmission film corresponds to the infrared light band of the continuously variable film 3, and preferably parallel to the continuously variable film 3 to realize a solution of multi-level light transmission effect. The visible light cut-off film 41 can avoid influence of 400-500 nm band optical information on collection of 800-1000 nm band data, and experiments verified that the 400-500 nm band optical information has little effect on collection of the 800-1000 nm band data.

The semi-transparent half-cut filter 4 and the detector 2 are separately coated through separately placing the semi-transparent half-cut filter 4 on the mounting structure. Therefore, process requirements and manufacturing costs of the semi-transparent half-cut filter 4 are lower, and flexibility of preparing the semi-transparent half-cut filter 4 is higher.

Embodiment 3

Referring to FIGS. 6-9, a hyperspectral camera based on a continuously variable film filter is illustrated, comprising: a camera body 1, wherein a detector chip 2 is installed in the camera body 1, and a continuously variable film 3 is coated on the detector chip 2; a semi-transmission half-cut filter 4 is provided in front of the continuously variable film 3, and a distance between the semi-transmission half-cut filter 4 and the continuously variable film 3 is larger than 0 mm.

A coating method for a hyperspectral camera based on a continuously variable film filter is also provided, comprising steps of:

installing the detector chip 2 in the camera body 1, and coating the continuously variable film 3 on the detector chip 2; then installing a packaging structure 6, which is not in contact with the continuously variable film 3, in front of the continuously variable film 3 in the camera body 1, and coating the infrared cut-off film 42 and the visible light cut-off film 41 in the same plane on the packaging structure 6, wherein the infrared cut-off film 42 corresponds to a visible light band of the continuously variable film 3, and the cut-off film 41 corresponds to an infrared light band of the continuously variable film 3.

When the distance between the semi-transmission half-cut filter 4 and the continuously variable film 3 is larger than 0 mm, the packaging structure 6 is provided in front of the continuously variable film 3 without contacting. However, the packaging structure 6 is required to be as close as possible to the continuously variable film 3, in such a manner that optical interference caused by incident light sequentially passing through the semi-transparent half-cut filter 4 and the detector chip 2 is greatly reduced, which can reduce distortion of spectral signals.

The rest of the embodiment 3 is the same as those of the embodiment 2, and will not be repeated here.

The above are the embodiments of the present invention. The above-mentioned embodiments and specific parameters in the embodiments are only for clearly describing the invention verification process, and are not intended to be limiting. The protection scope of the present invention is still subject to the following to claims. Any equivalent structural changes made by using the description and drawings of the present invention shall be included in the protection scope.

What is claimed is:

1. A hyperspectral camera based on a continuously variable film filter, comprising: a camera body (1), wherein a detector chip (2) is installed in the camera body (1), and a continuously variable film (3) is coated on the detector chip (2); a semi-transmission half-cut filter (4) is provided in front of the continuously variable film (3), and a distance between the semi-transmission half-cut filter (4) and the continuously variable film (3) is 0 mm or larger than 0 mm.

2. The hyperspectral camera, as recited in claim 1, wherein the semi-transmission half-cut filter (4) is coated on the continuously variable film (3).

3. The hyperspectral camera, as recited in claim 2, wherein the semi-transmission half-cut filter (4) comprises an infrared cut-off film (42) and a transmission film group.

4. The hyperspectral camera, as recited in claim 3, wherein the transmission film group comprises a visible light cut-off film (41) or a full transmission film.

5. The hyperspectral camera, as recited in claim 1, wherein a mounting structure, which is not in contact with the continuously variable film (3), is installed in front of the continuously variable film (3), and the semi-transmission half-cut filter (4) is coated on the mounting structure.

6. The hyperspectral camera, as recited in claim 5, wherein the mounting structure comprises a lens structure (5) or a packaging structure (6).

7. The hyperspectral camera, as recited in claim 5, wherein the semi-transmission half-cut filter (4) comprises an infrared cut-off film (42) and a transmission film group.

8. The hyperspectral camera, as recited in claim 7, wherein the transmission film group comprises a visible light cut-off film (41) or a full transmission film.

\* \* \* \* \*